(12) United States Patent
Murayama et al.

(10) Patent No.: US 6,403,476 B2
(45) Date of Patent: Jun. 11, 2002

(54) SEMICONDUCTOR CHIP, SEMICONDUCTOR WAFER, SEMICONDUCTOR DEVICE AND METHOD OF MANUFACTURING THE SEMICONDUCTOR DEVICE

(75) Inventors: Jin Murayama, Miyagi; Masao Mitani, Kanagawa, both of (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/917,208

(22) Filed: Jul. 30, 2001

(30) Foreign Application Priority Data

Jul. 31, 2000  (JP) ........................................ 2000-230347
Jun. 29, 2001 (JP) ........................................ 2001-197699

(51) Int. Cl.⁷ .............................................. H01L 21/44
(52) U.S. Cl. ........................ 438/667; 438/669; 438/945
(58) Field of Search ............................... 438/666, 667, 438/669, 945

(56) References Cited

U.S. PATENT DOCUMENTS

| | | | | |
|---|---|---|---|---|
| 3,808,751 A | * | 5/1974 | Usui | ............................ 51/312 |
| 4,900,687 A | * | 2/1990 | Partin et al. | .................... 438/48 |
| 5,703,433 A | * | 12/1997 | Fujii et al. | .................. 313/484 |
| 5,725,787 A | * | 3/1998 | Curtin et al. | .................. 216/25 |
| 5,919,569 A | * | 7/1999 | Obiya et al. | .............. 428/423.7 |

FOREIGN PATENT DOCUMENTS

| | | | | |
|---|---|---|---|---|
| EP | 0 840 364 A1 | * | 5/1998 | ......... H01L/21/304 |
| JP | 9-232608 | * | 9/1997 | ........... H01L/31/04 |

\* cited by examiner

*Primary Examiner*—T. N. Quach
(74) *Attorney, Agent, or Firm*—Whitham, Curtis & Christofferson, P.C.

(57) ABSTRACT

An object of the present invention is forming a concave portion (including a penetration hole) in a semiconductor substrate by a sandblast method without causing a defect such as a chip or a crack in processing ends of the concave portion. In order to achieve the object, in a semiconductor wafer in which a plurality of semiconductor chips are formed, a metal film is formed on the semiconductor substrate at least in a region of a predetermined range in an inside and an outside of an circumferential portion except for a central portion and its vicinity of a region in that the concave portion (including the penetration hole) of the respective semiconductor chips is to be formed. Then, the entire surface of the semiconductor wafer including the metal film is masked except for the region in that the concave portion of the respective semiconductor chips is to be formed. With this state, the concave portion is formed in the respective semiconductor chips formed on the semiconductor wafer by the sandblast method.

7 Claims, 3 Drawing Sheets

SEMICONDUCTOR CHIP, SEMICONDUCTOR WAFER, SEMICONDUCTOR DEVICE AND METHOD OF MANUFACTURING THE SEMICONDUCTOR DEVICE

BACKGROUND OF THE INVENTION

1. Field of the Invention

The present invention relates to a semiconductor chip, a semiconductor wafer, and a semiconductor device, in which a concave portion (including a penetration hole) is formed in a semiconductor substrate, by using a sandblast method, and a method of manufacturing the semiconductor device.

2. Description of the Related Art

For example, when a recording head of a thermal inkjet printer is manufactured, a driver circuit is formed on a semiconductor substrate such as a silicon substrate and a heater (heating resistor) material is laminated thereon. Further a cavity as an ink room for each pixel and an orifice nozzle as a discharge opening of ink are formed on the heater. Since the ink is supplied from the rear side surface of the silicon substrate, an ink supply hole (a penetration hole) which penetrates the silicon substrate is formed.

Generally, the above ink supply hole is formed from both side surfaces of the silicon substrate by using the sandblast method in view of a hole forming speed. In the sandblast method, as known well, a region except for a region to be dug is masked and then a particle with a small size, such as alumina, is blasted to a semiconductor device with a semiconductor wafer state at a predetermined rate. Thus, the silicon substrate and the structure formed thereon are mechanically removed.

Therefore, there is the following problem in the case of a semiconductor (silicon) device in which the concave portion (including the penetration hole) is necessarily formed in the silicon substrate by the sandblast method. That is, a defect such as a chip or a crack is easily caused in processing ends of the concave portion by chipping. The chipping is a phenomenon that, when silicon in a region in which the concave portion is formed is removed, not only silicon in a region in which sandblasting particles collide and but also silicon (removal is not desired) in a region outside of a circumferential portion of the concave portion are removed together.

SUMMARY OF THE INVENTION

An object of the present invention is to provide a semiconductor chip, a semiconductor wafer, and a semiconductor device, in which the problem based on the above related art is solved and a concave portion (including a penetration hole) is formed in a semiconductor substrate by a sandblast method, without causing a defect such as a chip or a crack in processing ends of the concave portion, and a method of manufacturing the semiconductor device.

In order to achieve the above object, according to the present invention, there is provided a method of manufacturing a semiconductor device in a semiconductor wafer in which a plurality of semiconductor chips are formed, comprising the steps of: forming a metal film on a semiconductor substrate in a region of a predetermined range in an inside and an outside of a circumferential portion except for at least a central portion and its vicinity of a region in that a concave portion of each of the semiconductor chips is to be formed; masking an entire surface of the semiconductor wafer including the metal film except for the region in that the concave portion of each of the semiconductor chips is to be formed; and forming the concave portion in each of the semiconductor chips formed on the semiconductor wafer by a sandblast method.

Here, a protective film for improving adhesion between the metal film and a material for masking is preferably formed on the metal film. In addition, a film thickness of the metal film is preferably in a range of 5 $\mu$m to 0.05 $\mu$m.

In addition, it is preferable that the metal film is formed on a front side surface of the semiconductor substrate and a formation of the concave portion is started from the front side surface of the semiconductor substrate. Alternatively, it is preferable that the metal film is formed on a rear side surface of the semiconductor substrate and a formation of the concave portion is started from the rear side surface of the semiconductor substrate. Alternatively, it is preferable that the metal films are formed on a front side surface and a rear side surface of the semiconductor substrate and a formation of the concave portion is started from the front side surface and the rear side surface of the semiconductor substrate.

Each of the semiconductor chips is preferably a recording head of a thermal inkjet printer.

Also, according to the present invention, there is provided a semiconductor device in a semiconductor wafer in which a plurality of semiconductor chips are formed, characterized in that a metal film is formed on a semiconductor substrate in a region of a predetermined range in an inside and an outside of a circumferential portion except for at least a central portion and its vicinity of a region in that a concave portion of each of the semiconductor chips is to be formed, an entire surface of the semiconductor wafer including the metal film is masked except for the region in that the concave portion of each of the semiconductor chips is to be formed, the concave portion is formed in each of the semiconductor chips formed on the semiconductor wafer by a sandblast method, and then, a subsequent semiconductor manufacturing process is continued with a state that at least a portion of the metal film is removed.

Also, according to the present invention, there is provided a semiconductor chip comprising: a semiconductor substrate in which at least one concave portion is formed; and a metal film which is formed on the semiconductor substrate in a region of a predetermined range in an outside of a circumferential portion of the concave portion, and in which an end surface of the circumferential portion of the concave portion is exposed.

Also, according to the present invention, there is provided a semiconductor wafer comprising: a plurality of semiconductor chips, in which each of the semiconductor chips includes, a semiconductor substrate in which at least one concave portion is formed, and a metal film which is formed on the semiconductor substrate in a region of a predetermined range in an outside of a circumferential portion of the concave portion, and in which an end surface of the circumferential portion of the concave portion is exposed.

DETAILED DESCRIPTION OF THE PREFERRED EMBODIMENTS

A semiconductor chip, a semiconductor wafer, a semiconductor device, and its manufacturing method of the present invention will be described in details based on a preferred embodiment showing the accompanying drawings.

Figure 1:
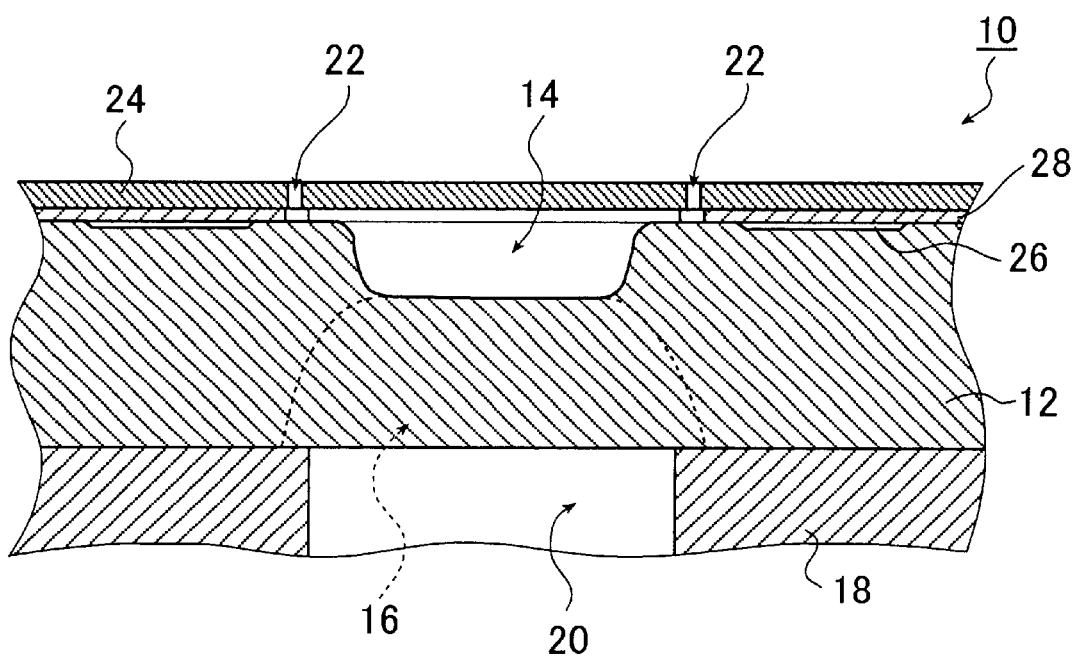
FIG. 1 is a cross sectional view of one embodiment of a recording head of a thermal inkjet printer according to the present invention.

FIG. 1 is a cross sectional view showing one embodiment of a recording head of a thermal inkjet printer according to the present invention. This drawing shows a semiconductor device 10 of the present invention, to which the manufacturing method of the present invention is applied and which is manufactured by using a semiconductor manufacturing technique. In the semiconductor device 10, an ink groove 14 for supplying ink to a nozzle is formed in the central portion (in the drawing) of a semiconductor substrate 12 such as a silicon substrate so as to dig the silicon substrate 12 down from its surface and extend the ink groove 14 in a direction vertical to the drawing paper surface.

In this ink groove 14, in order to supply the ink to the ink groove 14, a plurality of ink supply holes (penetration holes) 16 for connecting the rear surface of the silicon substrate 12 with the ink groove 14 are formed in the extension direction of the ink groove 14 at predetermined intervals. Note that a support frame 18 is a support member for locating the silicon substrate 12. In this support frame 18, an ink groove 20 for supplying the ink from an ink tank (not shown) to the ink groove 14 formed in the front side surface of the silicon substrate 12 through the ink supply holes 16 is formed.

In laterally symmetrical positions (in the drawing) sandwiching the ink groove 14, two nozzle columns in which a plurality of nozzles 22 are alternately arranged at regular intervals along the ink groove 14 are provided. The respective nozzles (orifices) 22 have a hollow circular shape and are formed in an orifice plate 24 which is laminated on the silicon substrate 12 and made of polyimide or the like. For example, in the case of 360 npi (nozzle per inch), with respect to the nozzle columns, the nozzles 22 are arranged in a direction vertical to the paper surface at a pitch of about 71 $\mu$m per column. Thus, a resolution of 720 npi can be realized by using these two columns.

Heat resistors (not shown) for controlling a discharge of ink from the respective nozzles 22 are formed over the silicon substrate 12 and under the nozzle columns. In addition, driver circuits 26 for driving the respective heating resistors are formed on the surface of the silicon substrate 12 outside the nozzle columns with the ink groove 14 as a center. A barrier wall 28 for forming an ink flow path for supplying the ink from the ink groove 14 to the respective nozzles 22 is formed between the surface of the silicon substrate 12 and the orifice plate 24.

The ink from the ink tank is passed through the ink groove 20 of the support frame 18, supplied to the ink groove 14 in the surface of the silicon substrate 12 through the ink supply holes 16 formed in the silicon substrate 12, and divided among the nozzle columns formed in both sides of the ink groove 14 through the ink flow path formed by the barrier wall 28. Then, the turning on and off of the respective heating resistors are controlled by the driver circuits 26 in accordance with image data and thus a predetermined amount of ink is discharged from the corresponding respective nozzles 22.

Hereinafter, a method of manufacturing a semiconductor device of the present invention will be described with reference to FIGS. 2A to 2C and 3.

Figure 2A:
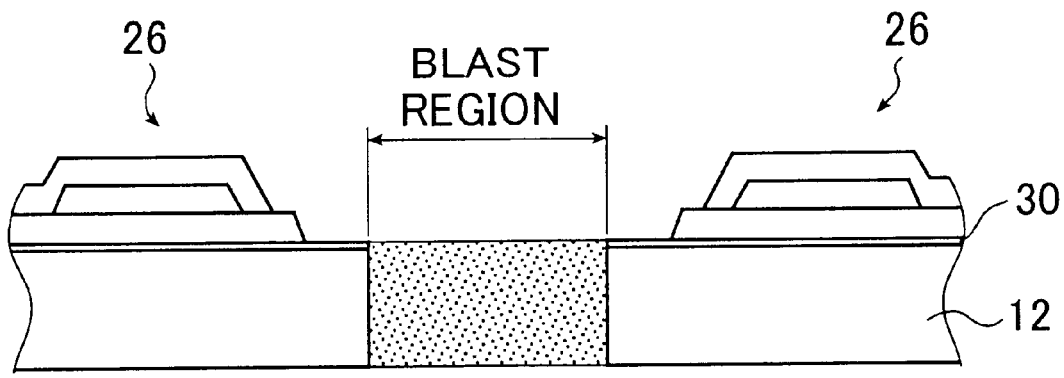
FIGS. 2A to 2C are cross sectional concept views of one embodiment showing a process for manufacturing a semiconductor device of the present invention.
Figure 2B:
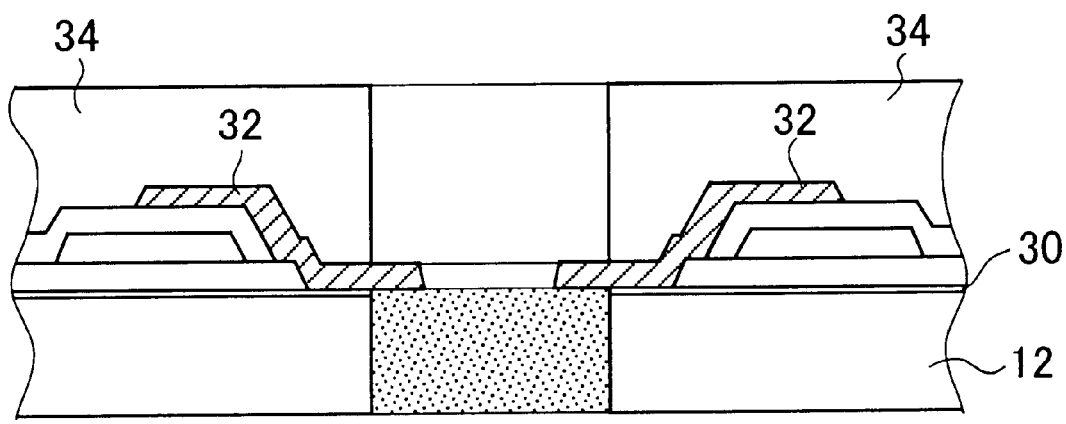
Figure 2C:
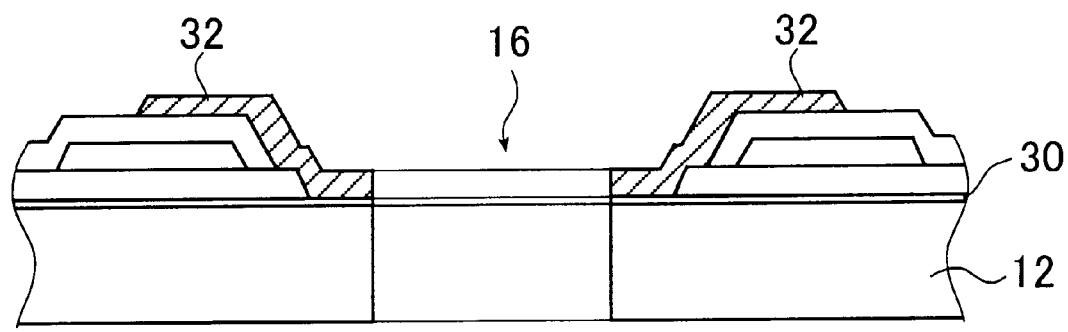

FIGS. 2A to 2C are cross sectional concept views of one embodiment showing a process for manufacturing a semiconductor device of the present invention.

These drawings are schematic cross sectional views showing a process for manufacturing the recording head of the thermal inkjet printer shown in FIG. 1 in the case where a silicon substrate is dug from its front side surface. A blast region shown in a middle portion of the silicon substrate 12 is a region that is dug by a sandblast method and becomes the ink supply hole.

FIG. 2A shows a state of a semiconductor device after driver circuits are formed on the silicon substrate. Here, a silicon oxide film 30 is formed on the front side surface of the silicon substrate 12. The driver circuits 26 are formed in both side regions of the blast region as the ink supply hole. Note that, in order to make the description easy, only one blast region as the ink supply hole is shown in this drawing. However, a sandblast is basically performed for the semiconductor device with a semiconductor wafer state.

Based on the semiconductor device manufacturing method of the present invention, first, in the semiconductor device shown in FIG. 2A, as shown in FIG. 2B, the metal film 32 is formed on the silicon substrate 12 of the circumferential portion and its vicinity of the blast region. Then, a mask pattern 34 is formed using a photo resist (mask material) by a photolithography technique. Note that the metal film 32 is formed with a toroidal form along the circumferential portion of the blast region without covering the central portion and its vicinity of the blast region.

The metal film 32 is not limited to a specific film. However, it is preferable that metal used in a general semiconductor manufacturing process, such as Al, W, Ni, Ti, Mo, Ta, or Pt, or its alloy is used. Also, the metal film 32 may be formed to cover the circumferential portion and its vicinity of the blast region as the ink supply hole, that is, a region that is within a predetermined range in the inside and the outside of the circumferential portion, except for a region that is a central portion and its vicinity of the blast region. A cover range by the metal film 32 may be suitably determined in accordance with a material, quality and the like of the metal film.

Note that, it is preferable that a film thickness of the metal film 32 is set in a range of 5 $\mu$m to 0.05 $\mu$m also in consideration of the material and the quality of it. When the film thickness of the metal film 32 is thinner than 0.05 $\mu$m, there is possibility that a portion of the film is not sufficiently formed dependent on a material. Thus, it is preferable that the film thickness is 0.05 $\mu$m or thicker. In addition, it is preferable that the metal film 32 formed in a region inside the circumferential portion of the blast region is thinner than 5 $\mu$m so as not to reduce polishing efficiency of the sandblast.

On the other hand, the mask pattern 34 is formed to cover the entire region except for the blast region that is opened by the sandblast method. Note that, in order to improve the adhesion between the metal film 32 and the mask pattern 34, a thin protective film having a thickness of 0.1 $\mu$m or thinner may be formed on the metal film 32. When the protective film has a thickness of 0.1 $\mu$m or thinner, this is instantly removed at the sandblast to instantly expose the surface of the metal film 32. Thus, the metal film 32 has the same effect regardless of the presence or absence of the protective film.

Figure 3:
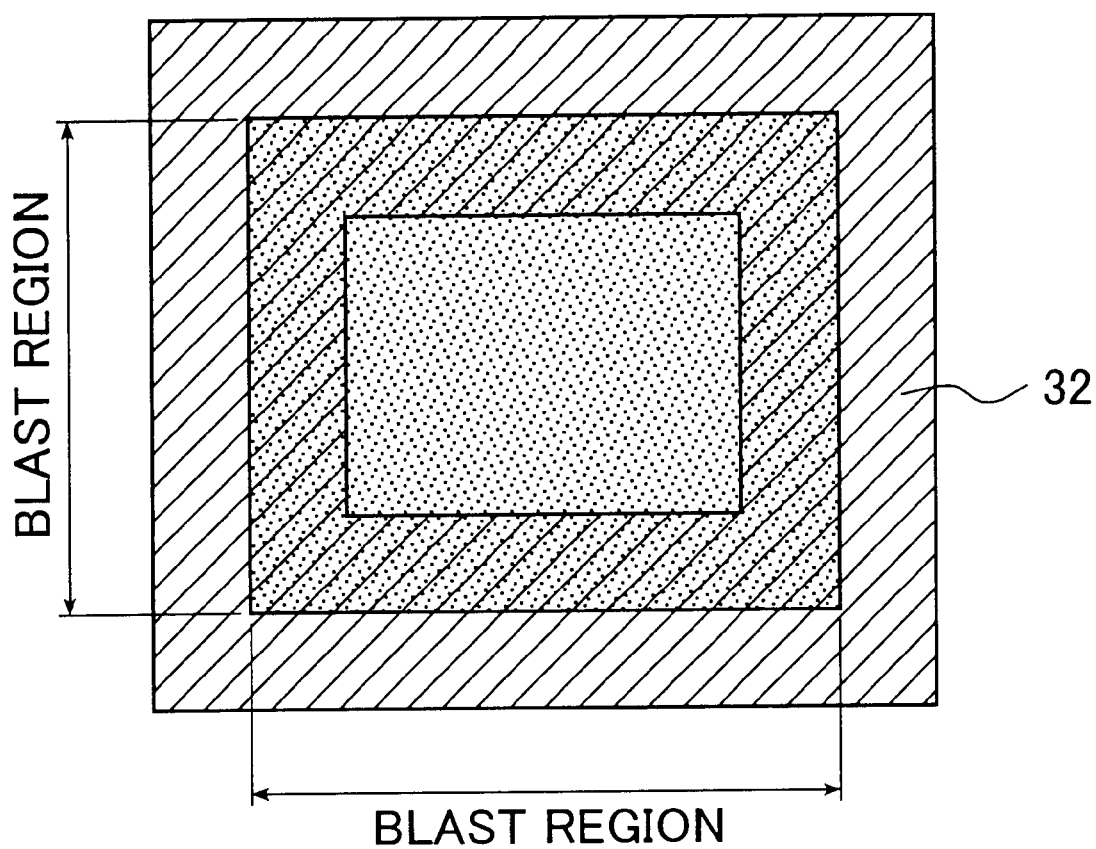
FIG. 3 is a plan concept view of one embodiment indicating the blast region and its vicinity in the semiconductor device manufactured by applying the present invention.

Here, a plan concept view of one embodiment indicating the blast region and its vicinity in the semiconductor device manufactured by applying the present invention is shown in FIG. 3.

As shown in this drawing, a dot portion of a central portion is the blast region as the ink supply hole. In addition, a hatching portion which is a region along the circumferential portion of the blast region and within a predetermined range in the inside and the outside of the circumferential portion is a region in that the metal film 32 is formed. Further, the mask pattern 34 is formed in a region except for the blast region, that is, a region except for the dot portion of the central portion.

Subsequently, the blast region of the silicon substrate 12 is dug from its front side surface by the sandblast method. Thus, as shown in FIG. 2C, the ink supply hole 16 that penetrates the silicon substrate 12 from the front side surface to the rear side surface is formed. Here, according to the semiconductor device manufacturing method of the present invention, while the occurrence of chipping is suppressed at the sandblast, the ink supply hole 16 that penetrates the silicon substrate 12 from the front side surface to the rear side surface can be opened in respective semiconductor chips formed on a semiconductor wafer.

That is, a particle with a small size, such as alumina, is blasted to the blast region at a predetermined rate to gradually remove the silicon substrate 12i. At this time, the circumferential portion and its vicinity of the blast region are protected by the metal film 32 having ductility. Thus, the occurrence of a defect such as a chip or a crack in the circumferential portion of the ink supply hole 16 by chipping can be suppressed. Note that, a region covered with the mask pattern 34 is shielded by the photo resist and thus not removed at all.

Note that, the metal film 32 which is shown in FIG. 2B and formed in a region within the blast region, is removed together at the sandblast, and thus the state as shown in FIG. 2C is obtained. FIG. 2C shows a state after the mask pattern of the photo resist is removed. Thus, immediately after the ink supply hole 16 is opened and the mask pattern 34 is removed, the metal film 32 is present on the silicon substrate 12 only outside the circumferential portion of the ink supply hole 16. End surfaces of the metal film 32 in the circumferential portion of the ink supply hole 16 are exposed.

According to the semiconductor device manufacturing method of the present invention, the metal film 32 is formed with the toroidal form along the circumferential portion of the blast region. Thus, there are the following advantages. That is, a removal amount of the metal film 32 by the sandblast is extremely smaller than that in the case where the metal film 32 is formed on the entire surface of the blast region. Thus, when the used sand is recycled, the sand and the metal can be easily separated. In addition, since the removal amount of the metal film 32 is small, the sandblast is easily made and thus its efficiency becomes high.

After the ink supply hole 16 is opened by the above processes, the mask pattern 34 is removed and then a subsequent semiconductor manufacturing process is continued. Note that a portion of the metal film 32 or the entire metal film 32 formed on the silicon substrate 12 may be removed. Alternatively, the entire metal film 32 is left without removing and then a subsequent semiconductor manufacturing process may be continued.

The semiconductor device manufacturing method of the present invention are basically as the above.

Note that, with respect to the digging of the semiconductor substrate, using the sandblast method, the semiconductor substrate may be dug from one side surface thereof, that is, either the front side surface or the rear side surface. In addition, the semiconductor substrate may be dug from one side surface thereof until the middle of digging and subsequently may be dug form the other side surface thereof to completely dig it. Therefore, the metal film may be formed on the front side surface, the rear side surface, or both side surfaces of the semiconductor wafer. Also, a shape of the concave portion, the number thereof, or the like is not limited.

The present invention can be applied to a recording head for a thermal inkjet printer using a semiconductor device as the above embodiment, independent on a difference between a monochrome print and a color print. In this case, known various recording head structures such as a top shooter type (face inkjet) or a side shooter type (edge inkjet) can be used. In addition, the number of nozzle columns and the number of recording elements are not limited.

Also, the present invention is not limited to the recording head of the thermal inkjet printer and thus can be applied to a semiconductor device in which the concave portion (including the penetration hole) has to be formed in the semiconductor substrate by the sandblast method.

The semiconductor device of the present invention means a semiconductor device with a semiconductor wafer state or a semiconductor chip state. The semiconductor chip may be a semiconductor chip with a package sealing state. Alternatively, the semiconductor chip may be not package-sealed.

The semiconductor chip, the semiconductor wafer, the semiconductor device and its manufacturing method of the present invention have been described above in detail. However, the present invention is not limited to the above embodiment, and various modifications may be naturally made in the scope not departing from the gist of the present invention.

As described above in details, according to the present invention, the metal film is formed over the semiconductor substrate in a region of a predetermined range in the circumferential portion and its vicinity except for the central portion and its vicinity of the region in which the concave portion (including the penetration hole) of the semiconductor chip is to be formed. Then, the concave portion is formed in the respective semiconductor chips that are formed on the semiconductor wafer by the sandblast method.

According to the present invention, since the metal film having ductility is formed along the circumferential portion of the region in that the concave portion is to be formed, there is the following effect. That is, the occurrence of chipping at the sandblast is suppressed and the concave portion can be formed by the sandblast method without causing a defect such as a chip or a crack in processing ends of the concave portion. Therefore, the manufacturing yield of the semiconductor device can be improved. In addition, according to the present invention, even if a weak mask material for the sandblast is used, the metal film functions as a protective film for protecting a circuit located thereunder. Thus, there is the same advantage that the manufacturing yield of the semiconductor device can be improved. Further, according to the present invention, the metal film is not formed in the central portion of the region in that the concave portion is to be formed. Thus, there is an advantage that the efficiency of the sandblast is not almost influenced. Also, when the sand is recycled, there is an advantage that an entrance amount of metal into the sand is less and separate operation can be easily performed.

What is claimed is:

1. A method of manufacturing a semiconductor device in a semiconductor wafer in which a plurality of semiconductor chips are formed, comprising the steps of:

forming a metal film on a semiconductor substrate in a region of a predetermined range in an inside and an outside of a circumferential portion except for at least a central portion and its vicinity of a region in that a concave portion of each of the semiconductor chips is to be formed;

masking an entire surface of the semiconductor wafer including the metal film except for the region in that the concave portion of each of the semiconductor chips is to be formed; and forming the concave portion in each of the semiconductor chips formed on the semiconductor wafer by a sand-blast method.

2. The method of manufacturing a semiconductor device according to claim 1, further comprising the step of forming a protective film for improving adhesion between the metal film and a material for masking on the metal film.

3. The method of manufacturing a semiconductor device according to claim 1, wherein a film thickness of the metal film is in a range of 5 $\mu$m to 0.05 $\mu$m.

4. The method of manufacturing a semiconductor device according to claim 1, wherein the metal film is formed on a front side surface of the semiconductor substrate and a formation of the concave portion is started from the front side surface of the semiconductor substrate.

5. The method of manufacturing a semiconductor device according to claim 1, wherein the metal film is formed on a rear side surface of the semiconductor substrate and a formation of the concave portion is started from the rear side surface of the semiconductor substrate.

6. The method of manufacturing a semiconductor device according to claim 1, wherein the metal films are formed on a front side surface and a rear side surface of the semiconductor substrate and a formation of the concave portion is started from the front side surface and the rear side surface of the semiconductor substrate.

7. The method of manufacturing a semiconductor device according to claim 1, wherein each of the semiconductor chips is a recording head of a thermal inkjet printer.

* * * * *